United States Patent [19]

Nakamura et al.

[11] Patent Number: 4,583,017

[45] Date of Patent: Apr. 15, 1986

[54] PIEZOELECTRIC VIBRATOR ON MIRROR POLISHED SUBSTRATE

[75] Inventors: Takeshi Nakamura, Kyoto; Kenji Ando, Kanagawa; Ikuo Matsumoto; Toshinori Miura, both of Kyoto, all of Japan

[73] Assignee: Murata Manufacturing Co., Ltd., Japan

[21] Appl. No.: 728,823

[22] Filed: Apr. 30, 1985

[30] Foreign Application Priority Data

May 1, 1984 [JP] Japan .................................. 59-88861

[51] Int. Cl.⁴ ............................................. H01L 41/08
[52] U.S. Cl. .................................... 310/321; 310/312; 310/348
[58] Field of Search .......... 310/312, 321, 348, 351–353

[56] References Cited

U.S. PATENT DOCUMENTS

| | | | |
|---|---|---|---|
| 2,261,791 | 11/1941 | Bokovoy | 310/312 |
| 2,705,392 | 4/1955 | Imler | 310/312 X |
| 3,924,312 | 12/1975 | Coussot et al. | 310/312 X |
| 4,451,755 | 5/1984 | Vig et al. | 310/312 X |
| 4,469,975 | 9/1984 | Nakamura et al. | 310/353 X |
| 4,472,654 | 9/1984 | Nakamura et al. | 310/312 X |
| 4,511,821 | 4/1985 | Nakamura et al. | 310/351 X |

*Primary Examiner*—Mark O. Budd
*Attorney, Agent, or Firm*—Otrolenk, Faber, Gerb & Soffen

[57] ABSTRACT

A piezoelectric vibrator operating in a spreading vibration mode has a vibrating plate of permanently elastic metal. At least one main surface of the vibrating plate is mirror-finished.

1 Claim, 7 Drawing Figures

PIEZOELECTRIC VIBRATOR ON MIRROR POLISHED SUBSTRATE

BACKGROUND OF THE INVENTION

The present invention relates to a piezoelectric vibrator operating in a spreading vibration mode which is made of permanently elastic metal such as "Elimvar" metal.

A conventional piezoelectric vibrator of this type utilizes the spreading vibration of long or short sides of the piezoelectric element which is in the form of a rectangular plate and the like. One example of the conventional piezoelectric vibrator is as shown in FIG. 1. In FIG. 1, reference numeral 2 designates a spreading vibration mode piezoelectric element. The piezoelectric element 2 has a vibrating plate 5 of permanently elastic metal, a piezoelectric film 8, and a vibrating electrode film 9. The middles of the short sides of the rectangular vibrating plate 5 are supported through a pair of coupling pieces 6 and 6 by a holding frame 7. The piezoelectric element 2 is accommodated in a case (not shown) by supporting the holding frame 7 therein. The piezoelectric vibrator utilizes the spreading vibration of the short sides of the vibrating plate 5. That is, the vibration of the piezoelectric vibrator is in the direction of the short sides with a node of the vibration on the line connecting the coupling pieces 6 and 6. The frequency of the vibration relates to the length of the short sides.

In general, the above-described spreading vibration mode piezoelectric vibrator is scarcely employed as a piezoelectric vibrator using the permanently elastic metal, and instead it is mainly employed as a flexure vibration mode piezoelectric vibrator such as a tuning fork or piece which is operated at a relatively low frequency. These vibrators are obtained by cold-working a permanently elastic material into thin plates. In the cold rolling method, the material is rolled by a rolling machine having a high rolling factor. Therefore, during rolling, a phenomenon that the surface of the product which is in contact with the roller is roughened (a so-called "surface-roughening phenomenon") is cuased, or the scratches on the rolling roller affect the surface of the product; that is, the products manufactured are unsatisfactory in surface finish. Accordingly, although a flexure vibration mode vibrator relatively large in size causes no problem during operation, if, in a spreading vibration mode vibrator such as the above-described conventional one, the piezoelectric element 2 is miniaturized to about 1 mm×1 mm, then the roughness s (10 μm usually) of the main surface 5a of the vibrating plate 5 cannot be disregarded. Furthermore, in the latter case, the products are fluctuated in the roughness s, and accordingly the vibrating plates 5 are not uniform in surface length and propagation speed. Accordingly, the characteristics such as for instance a resonance frequency characteristic are not sufficiently stable, with the results that the products are low in reliability, and it is not practical to miniaturize the vibrator so that it can be used for high frequency.

SUMMARY OF THE INVENTION

In view of the foregoing, an object of the present invention is to provide a piezoelectric vibrator operating in a spreading vibration mode in which at least one main surface of a vibrating plate of permanently elastic metal is mirror-finished, to stabilize the characteristics such as for instance a resonance frequency characteristic, and to improve the reliability.

DESCRIPTION OF THE PREFERRED EMBODIMENT

This invention will be described in detail with reference to its one embodiment shown in the accompanying drawings.

Figure 1:
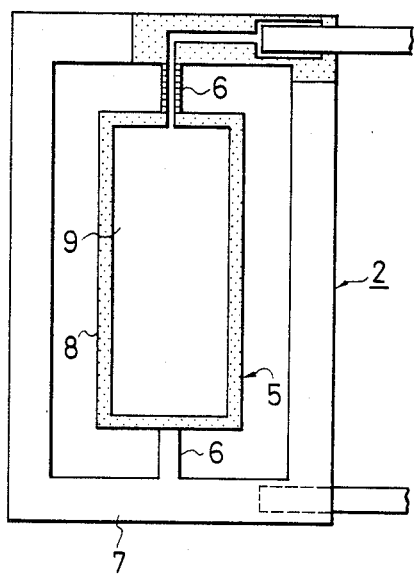
FIG. 1 is a plan view showing essential components of a conventional piezoelectric vibrator operating in a spreading mode.
Figure 2:
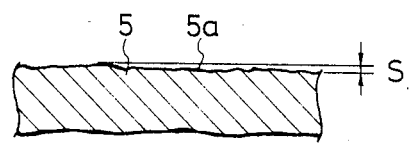
FIG. 2 is an enlarged sectional view showing a part of a vibrating plate which is obtained according to a conventional method.
Figure 3:
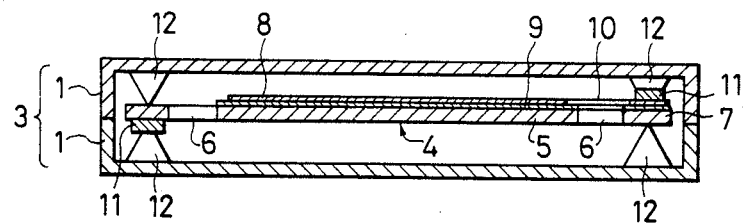
FIG. 3 is a vertical sectional view showing a piezoelectric vibrator operating in a spreading vibration mode according to the present invention.
Figure 4:
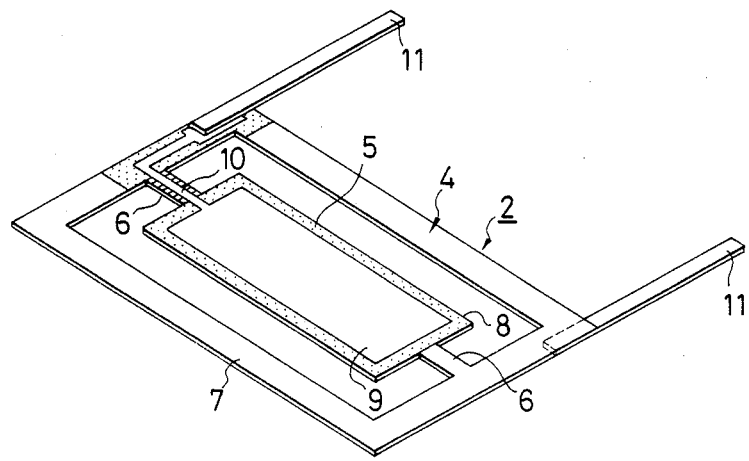
FIG. 4 is a persective view showing an integral frame in the piezoelectric vibrator shown in FIG. 3.

FIG. 3 is a sectional view showing a piezoelectric resonator utilizing a short side spreading vibration mode, which is the embodiment of the invention; and FIG. 4 is a perspective view showing essential components of the piezoelectric resonator. The piezoelectric resonator is a miniatuarized one for high resonance frequency. In FIG. 3, reference numeral 1 designates the upper and lower halve of a case 3 of synthetic resin. Each of the upper and lower halves 1 is in the form of a shallow box which opens on one side. The case 3 is formed by combining the upper and lower halves 1 and 1 in such a manner that the open surfaces are put together.

As shown in FIG. 4, the piezoelectric element 2 has an integral frame 4 made of a permanently elastic metal plate such as an "Elimbar", "Imbar" or "Coelimbar" plate. The frame 4 is such that a vibrating plate 5 which is substantially rectangular as view from above is supported by a rectangular holding frame 7 through a pair of coupling pieces 6 and 6 which are extended from the middles of the short sides of the vibrating plate 5. The integral frame 4, especially the vibrating plate 5, has the mirror finish. A piezoelectric film 8 of zinc oxide (ZnO) is fixedly formed over a predetermined area of one main surface of the integral frame 4; i.e., the entire surface of the vibrating plate 5 and the region which is extended from the vibrating plate through one coupling piece 6 to a predetermined corner of the holding frame 7, by a sputtering method or the like. A vibrating electrode film 9 confronting the vibrating plate 5, and a leader 10 are vacuum-deposited on the piezoelectric film 8. The leader 10 is extended from the electrode film 9 through the one coupling piece 6 to the predetermined corner of the holding frame 7. The vibrating electrode film 9 is of aluminum or the like. In FIG. 4, reference numeral 11 designates two lead wires extended from the integral frame 4. One of the lead wires 11 is connected to the end of the leader 10, while the other 11 is connected to the holding frame 7. Both sides of the piezoelectric element 2 thus constructed are covered by the above-described upper and lower halves 1 and 1, and then the upper and lower halves are sealingly joined together by welding or by using adhesive. When the integral frame 4 is inserted in the case 3 as described above, the four corners of the holding frame 7 are clamped by protrusions 12 which are extended from the inner surfaces of the halves 1 in such a manner that the protrusions 12 are in point-contact with the holding frame. Thus, the integral frame 4 has been held in place in the case 3.

Figure 5A:
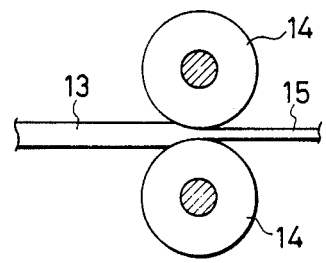
FIGS. 5(a) and 5(b) are sectional views showing steps of manufacturing a vibrating plate in the piezoelectric plate of the present invention.
Figure 5B:
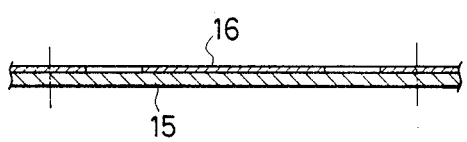

The integral frame 4 is formed according to manufacturing steps shown in FIGS. 5(a) and 5(b) for instance. A permanently elastic material 13 is cold-rolled by rollers 14 and 14 with a high rolling percentage of about 75%, to obtain a thin plate 15 (as shown in FIG. 5(a)). For instance, a plate of 4 mm in thickness is cold-rolled into a plate of 1 mm in thickness. A single or both surfaces of the permanently elastic metal plate 15 are mirror-finished by a mirror polishing method such as a barrel polishing method. Then, the plate 15 is subjected to etching with a mask 16 on it (as shown in FIG. 5(b)), to form the vibrating plate 5, the coupling pieces 6 and 6, and the holding frame 7. The plate 15 thus treated is cut as required, to obtain the integral frame 4.

Figure 6:
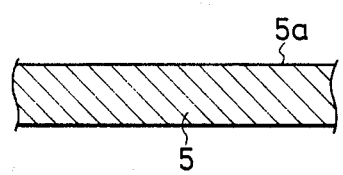
FIG. 6 is an enlarged sectional view showing a part of the vibrating plate.

FIG. 6 is an enlarged sectional view of a part of the vibrating plate thus formed. The propagation speed of an elastic wave propagating along the main surface 5a of the vibrating plate 5 was 4546 m/s. The propagation speed was 4473 m/s before the main surface was mirror-finished. This means that the resonance frequency fluctuation can be reduced by increasing the surface accuracy of the vibrating plate 5.

As is apparent from the above description, in the piezoelectric vibrator operating in the spreading vibration mode in which the piezelectric element having the vibrating plate of permanently elastic metal is supported through the coupling pieces by the holding frame, according to the present invention, at least one of the main surfaces of the vibrating plate is mirror-finished. Therefore, the length of the vibrating plate's surface is considerably decreased when compared with that of the conventional one, and the propagation speed of the elastic wave becomes constant. Accordingly, not only the resonance frequency fluctuation can be reduced, but also other characteristics can be stabilized. Furthermore, when the piezoelectric element is formed by etching, it can be manufactured with high dimensional accuracy, and the orientation of the piezoelectric film of zinc oxide (ZnO) formed on the vibrating plate can be improved. In addition, the piezoelectric vibrator can be readily miniaturized so that it can be used for high frequency. In this connection, fluctuation of the resonance frequency is reduced. Therefore, the adjustment can be achieved merely by trimming the resonance frequency slightly, and the manufacturing labor is reduced as much, which will contribute to reduction of the manufacturing cost and to increase of the manufacturing efficiency.

What is claimed is:

1. A piezoelectric vibrator operating in a spreading vibration mode, comprising:
   a piezoelectric element having a vibrating plate of permanently elastic metal;
   coupling pieces; and
   a holding frame for supporting said piezoelectric element through said coupling means, in which at least one of the main surface of said vibrating plate is mirror-finished.

* * * * *